US 6,718,523 B2

(12) United States Patent
Hathaway et al.

(10) Patent No.: US 6,718,523 B2
(45) Date of Patent: Apr. 6, 2004

(54) REDUCED PESSIMISM CLOCK GATING TESTS FOR A TIMING ANALYSIS TOOL

(75) Inventors: David J. Hathaway, Underhill Center, VT (US); Jeffrey P. Soreff, Poughkeepsie, NY (US); Neil R. Vanderschaaf, Round Rock, TX (US); James D. Warnock, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/899,413

(22) Filed: Jul. 5, 2001

(65) Prior Publication Data

US 2003/0009733 A1 Jan. 9, 2003

(51) Int. Cl.[7] .............................................. G06F 17/50
(52) U.S. Cl. .................................. 716/4; 716/6; 716/18
(58) Field of Search ........................... 716/4, 6, 12, 16, 716/17, 18; 327/99

(56) References Cited

U.S. PATENT DOCUMENTS

| | | | | |
|---|---|---|---|---|
| 5,457,638 A | * | 10/1995 | Ashar et al. ..................... 716/6 |
| 5,483,185 A | | 1/1996 | Scriber et al. .................. 327/99 |
| 5,508,937 A | * | 4/1996 | Abato et al. ..................... 716/6 |
| 5,623,223 A | | 4/1997 | Pasqualini ...................... 327/99 |
| 5,629,901 A | | 5/1997 | Ho .............................. 365/194 |
| 5,740,347 A | * | 4/1998 | Avidan ........................... 716/6 |
| 5,808,486 A | | 9/1998 | Smiley .......................... 327/34 |
| 5,864,487 A | | 1/1999 | Merryman et al. ............. 716/6 |
| 5,980,092 A | | 11/1999 | Merryman et al. ............. 716/6 |
| 6,049,236 A | * | 4/2000 | Walden ......................... 327/99 |
| 6,055,587 A | | 4/2000 | Asami et al. ................. 327/165 |
| 6,111,898 A | | 8/2000 | Banik et al. ................. 327/408 |
| 6,167,557 A | * | 12/2000 | Kudva et al. ................... 716/6 |
| 6,305,003 B1 | * | 10/2001 | McBride ....................... 716/12 |
| 6,334,205 B1 | * | 12/2001 | Iyer et al. ..................... 716/6 |
| 6,457,167 B1 | * | 9/2002 | Kitahara ...................... 716/18 |

FOREIGN PATENT DOCUMENTS

EP 0 361 233 4/1990

OTHER PUBLICATIONS

D. Hathaway, "Loop Breaking and Clock Gating Tests in Timiing Analysis", IBM Technical Disclosure Bulletin, Vl. 37, No. 09, Sep. 1994, pp. 433–434.

* cited by examiner

Primary Examiner—Trong Phan
(74) Attorney, Agent, or Firm—McGinn & Gibb, PLLC; Richard M. Kotulak, Esq.

(57) ABSTRACT

A method for analyzing a gated clock design in which a disabling clock gating transition prevents an output transition from occurring, assuring that no clock glitching occurs. Delays and slews are computed so that the arrival time computation that includes clock and gate signal delays are computed at the output, providing tests which ensure that no glitch situation occurs. The delays and slews are computed using a static timing analysis, which includes situations such as a late and early arriving gate clock signals. The invention may be used in any static timing analysis test to ensure that a first transition on one input of a circuit prevents the propagation of a second transition on another input of the circuit.

34 Claims, 6 Drawing Sheets

REDUCED PESSIMISM CLOCK GATING TESTS FOR A TIMING ANALYSIS TOOL

BACKGROUND OF THE INVENTION

1. Field of the Invention

The present invention generally relates to timing analysis tools. More particularly, the present invention relates to an improved method and system for the calculation of quantities to perform clock gating tests at gating devices during an integrated circuit design.

2. Description of the Related Art

Integrated circuit (IC) manufacturers have continuously sought to build smaller and more efficient integrated circuit chips that contain an increasing number of devices. Because the designing of IC chips is so complex, a programmed data processor is essential. The most common method of designing logic circuits for placement on IC chips is done with the use of computer systems and software that use computer-aided design (CAD) tools. Particular components that allow for an efficient design, checking and testing of very large scale integrated circuits (VLSI) are referred to as logic synthesis and physical design tools.

A logic synthesis tool takes as input a functional description of a logic circuit, typically written in a language such as VHDL, and then converts it into a technology level description. The circuits in this technology level description are then placed and the wires interconnecting them are routed by physical design tools, producing a set layout level representation that a chip foundry can use to actually build the chip. The output of the logic synthesis tool is referred to as a net list, which is actually a list of cells from a technology library and the necessary interconnections between the cells. The output of the physical design tools includes a "placement" (the assignment to each circuit in the net list of a physical location on the chip), and a "routing" (the assignment to each net in the net list a set of wire segments which implement the interconnections defined by the net), collectively referred to as the physical layout of the chip. Thus, the output of the electronic design automation system may be regarded as a template for the fabrication of the physical embodiment of the integrated circuit.

While generating the netlist and physical layout of the IC, these CAD tools must meet the timing constraints that are specified as part of the design. Timing tools, such as IBM's "EinsTimer" tool system, provide timing analysis of circuit net lists and layouts by working in conjunction with the synthesis and physical design tools. Logical and physical changes, based on this analysis, can then be implemented to achieve the desired timing constraints.

Static timing tools are used to ensure that a design implementation (net list and layout) meet imposed timing requirements. Timing correctness could be verified using delay simulation, or dynamic timing analysis, instead, in which specific waveforms are applied to the inputs of the design and resulting waveforms are produced at all points in the design. Such methods are more accurate than static timing analysis, and because of this the delays, tests, and propagations computed by static timing analysis must generally be somewhat pessimistic, meaning that they require signals to arrive earlier (through larger setup test values) or to be held longer (through larger hold test values) than might actually be necessary for correct design operation. But complete verification through simulation requires that all possible sets of input waveforms be simulated, and the number of such sets grows exponentially with the number of design inputs, making it impossible in practice to completely verify a design. The goal of a static timing analysis method is to avoid optimism (i.e., saying that a design will operate correctly when there is some input pattern whose simulation will indicate a failure), while minimizing pessimism (i.e., requiring a signal to become stable earlier or remain stable later than would be required by the simulation of any possible input pattern. Thus one way to determine the correct setup or hold test between a pair of input signals to a gate is to simulate transitions on the input signals with a variety of different spacings (differences in arrival times), and find the minimum spacing which causes the gate to have the required output. This will be the criterion against which the invention described below is measured. In particular, a designer is often concerned with a clock signal of a synchronous digital design of an IC, which synchronizes the storage of data into storage elements such as latches or flip-flops. The data held in particular storage elements is not always required during every clock cycle, and clock gating signals can be used to turn off the clock signal to such portions of the design during selected clock cycles. This can be done for functional reasons and/or to reduce power consumption, since energy that is proportional to the capacitance of the clock net is required to cause clock transitions on the clock net. Gating the clock reduces the total capacitance being switched in any given cycle. As an example, an AND gate 140 used for clock gating is shown in FIG. 1 along with idealized clock and gate signal waveforms, which are shown in FIG. 2. In FIG. 1, the AND gate 140 outputs 120 a high signal only when the clock 100 and gate 110 signals are also at a high state. Therefore, the output 120 would have a high signal only when both the gate 110 and clock signal 100 are high during time 200. Conversely, the output 120 would be low during the time 201 when only the clock signal was high. In this example, the gate signal 110 prevents the clock signal 100 from being output 120 during time 201. This is commonly referred to as "clock gating".

When clock gating is performed, it is important that the gate signal be stable during the portion of the clock cycle during which the clock is not to control the circuit in question. Thus, an AND gate disables pulses of an active-high clock, while an OR-gate disables pulses of an active-low clock. In other words, the clock gate is required to enable the entire clock pulse to pass through, or to block the entire clock pulse. If the timing of the gate signal is off, clock "clipping" (shortening of an intended clock pulse) and "glitching" (occurrence of a portion of an unintended clock pulse) can occur, as shown in FIG. 3. More specifically, because the gate the signal 110 is shifted later in time in FIG. 3 when compared to FIG. 2, the first clock signal 200 is shortened because the beginning portion is "clipped". To the contrary, the clock signal 201 which should not have been output (should have been non-controlling) is inadvertently output to as a "glitch".

This requirement on the clock gate signal is ensured through static timing analysis, in which tests are imposed between the clock and gate signals. In particular, a setup test is imposed requiring that the gate signal be stable before the clock transitions to the non-controlling state, and a hold test is imposed requiring that the gate signal be held stable until after the clock transitions to the controlling state. These tests can be performed at the inputs of the clock gate, but because the delays from the clock and gate input of the gating circuit may differ, this may not ensure proper operation. As an example, consider an AND gate, as shown in FIG. 4, wherein the delay from the gate input to the output (delta-g) 141 is larger than that from the clock input to the output (delta-c) 142, as shown in FIG. 5. Here, even though the input gate signal 110 arrives to disable the clock 100 before the clock input arrives, the delay difference within the AND circuit 140 causes a glitch to occur on the output. In other words, a glitch 500 would occur on the output 120 because the clock signal 100 was so much faster than the gate signal 110, that the high clock signal 100 would arrive at the clock output 120 before the gate signal 110 had an opportunity to prevent it.

During the IC design, CAD tools are used that deal with timing constraints present throughout the circuitry. These tools provide timing analysis of circuit net lists and layouts by working in conjunction with the logic synthesis and physical design tools. EinsTimer is such a tool that is commercially available to provide this static timing analysis, made by International Business Machines Corporation, Armonk, N.Y., USA. Aspects of this tool are discussed in IBM Technical Disclosure Bulletin, Vol. 37, No. 9, pages 433–34 (September 1994) incorporated herein by reference. Presently used clock gating tests that are performed are between an arrival time (AT) at the gate output rather than at the gate input (i.e., between $AT_{clock}+delay_{clock}$ and $AT_{gate}+delay_{gate}$). In FIGS. 6A and 6B the signal arrival times and slew are represented as follows: $AT_{clock}$ (ATc in the drawings), $AT_{gate}$ (ATg in the drawings), $Slew_{clocl}$ (Slew c in the drawings) and $Slew_{gate}$ (Slew g in the drawings).

Signals are not ideal sharp edges, but instead have some non-zero slew time, which is the time between when the signal starts making a transition and when it finishes the transition, often measured from the time when 10% of the transition has occurred to the time when 90% of the transition has occurred. Because of this, these tests are done between the beginning of one transition and the end of the other (i.e., a setup test between $AT_{Clock}+delay_{Clock}-Slew_{clock}/2$ and $AT_{gate}+delay_{gate}+Slew_{gate}/2$, or a hold test between $AT_{Clock}+delay_{clock}+Slew_{clock}/2$ and $AT_{gate}+delay_{gate}-Slew_{gate}/2$). Note that the AT values are the arrival times at the gate inputs, the delay values are the delays from the 50% signal crossing point at the input of the AND circuit to the 50% crossing point at the output of the AND circuit (600, 601), and the slew values are the times it takes for output transitions propagated from the respective inputs to complete. The 0.5 slew multiplier may be changed depending on the way in which slews are defined, for example, when slews are defined as the 10% to 90% interval, this factor is set to 0.625, as this provides a better estimate of the true beginning or end of the signal transition. Waveforms meeting such a setup test are shown in FIG. 6A. This "propagated" clock gating test mode of EinsTimer is used for timing sign-off. FIG. 6A illustrates the signal relationship required by tests in conventional timing systems. FIG. 6B illustrates the signal relationship required under particular conditions by the invention and is discussed in greater detail below.

One benefit of this approach is that no special characterization of the clock gate circuit is required to determine setup and hold test values. This feature is important since it allows the use for clock gating of arbitrary gates in a circuit library, rather than restricting gating to a set of pre-characterized clock gating circuits having predefined setup times as similarly taught in U.S. Pat. No. 5,980,092 (incorporated herein by reference). This patent teaches a method for optimizing a design that uses a gated clock structure and uses an optimizer tool to determine the relative timing of two or more signals that arrive at a logic gate. The method of this patent also includes the use of a clock tree within a circuit design. Further, an optimization tool is used to optimize the clock tree such that the clock control signal arrives at the storage element within the predefined setup and hold times of the clock signal.

In view of the above, there is a need in timing analyzers, to safely relax the constraints on the input of a gate signal to the gating device. There is also a need to modify the current clock gating test mode to handle gating signal transitions which disable a clock (i.e., prevent a clock output transition) differently from gating signal transitions which enable a clock (i.e., allow a clock output transition). This method relaxes the constraints on the clock gating signal while still preventing clock "glitching" and "clipping" from occurring at the output.

SUMMARY OF THE INVENTION

In view of the foregoing and other problems, disadvantages, and drawbacks of the conventional timing analysis tools for designing an integrated circuit, the present invention has been devised, and it is an object of the present invention to provide a method and system for determining proper setup and hold times in gating devices.

To attain the object suggested above, there is provided, according to one aspect of the invention, a method for analyzing a gated clock design, wherein tests involving a disabling clock gating transition which never causes an output transition are treated differently from enabling clock gating transitions which allow output transitions to occur. Delays and slews are computed so that the arrival time computation that includes clock and gate signal delays produces arrival times and slews at the output, and tests between these arrival times prevent a glitch or clock clipping situation from occurring. The delays and slews are computed using a static timing analysis, which considers situations such as late and early arriving gating and clock signals. The invention may be used in any static timing analysis test to ensure that a first transition on one input of a circuit prevents the propagation of a second transition on another input of the circuit.

In one embodiment, the method determines when a first-type of signal is present on a first input to a logical gating device (the first-type of input signal inhibits the propagation to the output of the gating device of transitions on a second input of the gating device) and when a second-type of signal is present on the first input (the second-type of input signal allows the propagation to the output of the gating device of transitions on the second input of the gating device). The invention modifies the timing of sensing of the first-type of signal to sense the first-type of signal at an earlier point in time than the second-type of signal is sensed. The time at which either the first-type or second-type of signal is sensed is compared against transitions propagated to the output of the gating device from the its second input to perform setup and hold tests which determine whether or not glitching or clipping may occur at the output of the gating device.

More specifically, the first-type and second-type of signal comprise gating signals applied to the first input of the gating device controlling whether pulses on the second input of the logical gating device are propagated to the output of the gate device. The first-type of signal prevents transitions from the second input from being propagated to the output of the gating device and the second-type of signal allows the clock pulses to be propagated to the output of the gating device.

The invention performs a setup test between the gate input and the clock input of the gating device in which the gate input is the first input and the clock input is the second input.

By modifying the time at which the first-type signal is sensed, the invention prevents a delay in propagation of the gate signal across the gating device from inappropriately predicting the outputting of a portion of a clock pulse. To increase the sensing timing of the first-type of signal, the invention assumes that there is no load on the output when computing the gate to output delay and/or identifies a beginning point of a transition of the output due to the first-type of signal as the sensing time of the first-type of signal. Such a setup test verifies that no glitch occurs on the gate output at the beginning of the clock pulse because a disabling gate signal (intended to prevent the propagation of the current clock pulse) arrives too late.

The invention also performs a hold test between the gate input and the clock input of the gating device, in which the clock is the first input and the gate is the second input. That is, a first-type non-controlling to controlling transition on the clock input (e.g., from high to low for an AND gating) prevents a transition on the gating device output due to a subsequent controlling to non-controlling transition (e.g., from low to high for an AND gating device) on the gate input non-controlling disables a transition. By modifying the time at which the first-type signal is sensed, the invention prevents an early transition of the gate signal from inappropriately predicting the outputting of a portion of a clock pulse. The increase in the sensing timing of the first-type of signal is accomplished as for the setup test, by assuming that there is no load on the output when computing the clock to output delay and/or identifying a beginning point of a transition of the output due to the first-type of signal as the sensing time of the first-type of signal. Such a hold test verifies that no glitch occurs on the gate output at the end of the clock pulse because an enabling gate signal (intended to allow the propagation of the following clock pulse) arrives too early.

The invention is used with a timing analyzer that approves or disapproves a circuit design from a timing standpoint. Such timing analyzers may not just strictly "approve" a circuit design, but instead may rate the circuit design on a graduated scale. The invention recognizes that timing constraints can be relaxed considerably when the logic circuit should block a signal (to reduce the pessimism of the circuit design). Therefore, the invention will approve the timing performance of many more circuit designs than would be approved conventionally. Similarly, the invention will give higher ratings (on the graduate scale) than will be done conventionally for the timing performance of the same circuit designs. The invention relaxes timing rules (decreases pessimism) through a number of mechanisms, such as assuming that there is no load on the gate signal and multiplying the slew by factor K to modify the signal sensing time. The invention realizes that when the logic circuit should block the clock signal, the timing analyzer only needs to observe that the beginning edge of the gate signal transition has started, to find an acceptable timing situation. Thus, the invention recognizes that the logic device (gating device) will stop the clock signal as soon as the gate signal begins to transition to what is logically a blocking (gated) situation.

Further, the invention not only approves the timing of many more circuit designs than would be approved conventionally, the invention also lets the designer know that the gating signal can arrive at a later point in time, or can begin transitioning earlier in the cycle, and still be effective. This allows the designer to change the design and make other portions of the circuit more efficient knowing that the gating signal can arrive later and still perform its intended function.

BRIEF DESCRIPTION OF THE DRAWINGS

The foregoing and other objects, aspects and advantages will be better understood from the following detailed description of a preferred embodiment(s) of the invention with reference to the drawings, in which.

DETAILED DESCRIPTION OF PREFERRED EMBODIMENTS OF THE INVENTION

As discussed in the Background section, gating devices are commonly used to control clock signals in an IC design and must have the proper timing. Gating device cells are particularly present in designs operated upon by automated logic design tools (i.e., logic synthesis tools, physical design tools, and static timing analysis timing tools) which attempt to ensure that complex circuits meet critical timing constraints. Advanced logic synthesis and timing analysis tools such as IBM's "Placement-Driven Synthesis" (PDS) system and "EinsTimer" timing analyzer include the ability to model multiple input/single-output blocks. The present invention operates by applying methods associated with gating cells designed with proper timing using improved automatic timing analysis methodologies that reduce circuit pessimism.

Figure 7:
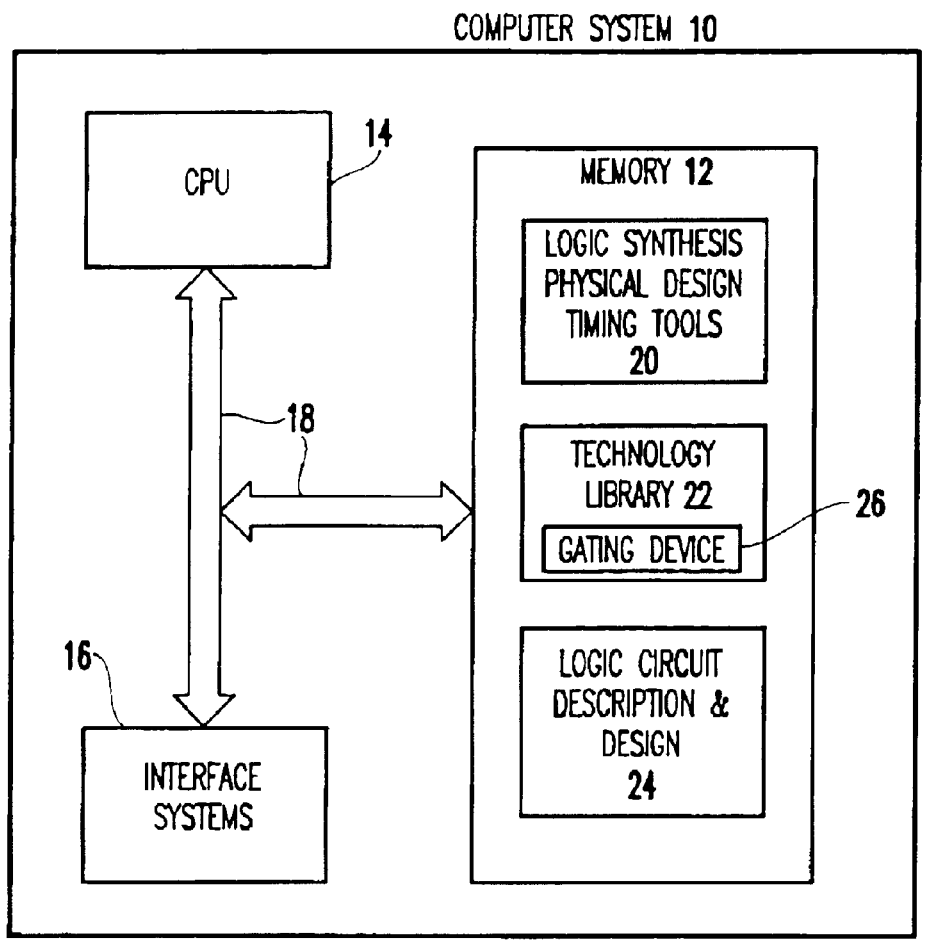
FIG. 7 shows a block diagram of the computer system of the present invention.

Referring now to the drawings, FIG. 7 shows a computer system of the present invention. Those skilled in the art will appreciate that the mechanisms and apparatus of the present invention apply equally to any computer system, regardless of whether the computer system is a complicated multi-user computing apparatus or a single user workstation. As shown in FIG. 7, computer system 10 comprises main or central processing unit (CPU) 14 connected to memory 12 and interface systems 16 via an interface bus 18. Although computer system 10 is shown to contain only a single main CPU and a single system bus, it should be understood that the present invention applies equally to computer systems that have multiple CPU's and to computer systems that have multiple buses that each perform different functions in different ways.

Interface systems 16 may involve complex input/output (I/O) systems that include separate, fully programmed microprocessors or may involve simple I/O adapters to perform similar functions. Interface systems 16 may include terminal interfaces, network interfaces, mass storage interfaces, or any other known interface systems. Memory 12 includes logic synthesis, physical design, and timing tools 20, a technology library 22 (that includes a gating device), and logic circuit descriptions 24. Logic circuit descriptions 24 may be stored in any recognized format, such as VHDL, and provide the functional description and timing requirements of the desired circuit. The logic synthesis, physical design, and timing tools 20 are software programs that transform functional descriptions and timing requirements of a desired logic circuit into a net list of cells and a layout, which can be used as a blueprint to build the actual IC chip. The technology library 22 provides the logic synthesis, physical design, and timing tools with various pre-designed gating cells 26 for use in the design as well as during the building of the actual integrated circuit.

The static timing tools 20 include use of incremental timing analysis as taught in commonly owned U.S. Pat. No. 5,508,937, which is hereby incorporated by reference. This teaching discloses an analyzer for selectively performing timing analysis on a revised electronic circuit design resulting from one or more modifications to an initial electronic circuit design having input nodes, output nodes, and active elements electrically connected there between in a set of signal paths interconnected by a plurality of nodes. Each signal path has a timing delay associated therewith. Data is recorded representative of the modification's affect on relative timing values for a set of signals propagated through the circuit design. The recorded data includes a leftmost frontier of change in relative timing values and a rightmost frontier of change in relative timing values. Upon presentation of a specific timing analysis request, incremental timing analysis on the selected portion of the modified electronic circuit design is conducted using the recorded frontiers of change to limit the timing value analysis.

Figure 8:
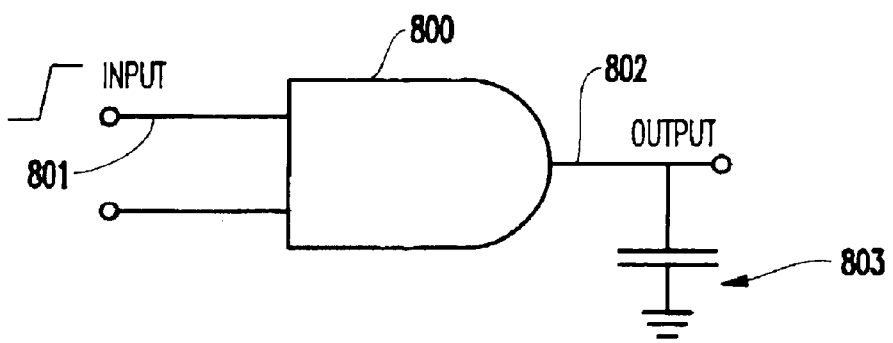
FIG. 8 shows an output from a gate device that has some finite capacitance representative of an output net that is attached.
Figure 9:
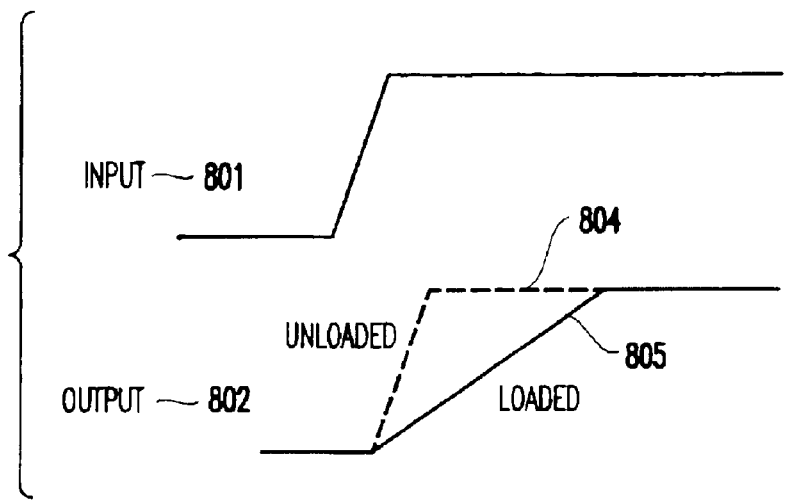
FIG. 9 shows a lightly loaded or unloaded output net attached to the gating device shown in FIG. 8.

The timing tool 20 includes delays and slews that are typically computed by assuming that an input transition on a gating device 26 causes an output transition to occur. Note that, as shown in FIG. 8, the output net 802 has some finite capacitance 803 that must be charged or discharged when the output transition occurs. Such a configuration is shown in FIG. 8 where the logical AND circuit is shown as item 800 having a clock input 801 which transitions from low to high. These delays and slews 805 may be much longer than they would be for a lightly loaded or unloaded output net 804 attached to the gating device 800 having an output capacitance as shown in FIG. 9. Additionally, if the clock gate timing is correct (i.e., no "clipping" or "glitching" occurs), the transition of the gate input signal to the controlling state never actually causes a transition on the gate output. Instead, during a disabling transition edge event, the gate input signal transition only blocks the propagation of the clock signal transition, holding the output at its previous value. When an opposite transition edge occurs, the gate input signal releases the block, thus allowing an output to follow the clock input signal. Similarly, during a cycle in which a clock pulse has been supressed, if the clock gate timing is correct, the trailing clock transition will not cause a transition on the gate output, as the gate signal will continue to hold the clock "off".

The invention uses these operational states to modify the current propagated clock gating test mode, as currently provided by the EinsTimer timing analyzer tool 20, to safely relax the constraints between the clock and gate inputs of the gating device 26.

In most applications, it is imperative that the gating signal does nothing to create a clock pulse on the output that is degraded from the original. The standard technique of handling this is to calculate setup times for the gate to the leading edge of the clock pulse and hold times for the gate to the trailing edge of the same clock pulse. Satisfaction of these tests ensures proper operation of the circuitry that is included and affected by the clock gate. Thus, the invention addresses how these setup time and hold time numbers are determined for an IC design.

In particular, the invention concerns the computation of tests which reduce pessimism of the clock gating (i.e., setup tests which allow the clock gating signal to become stable later, and hold tests which allow the gating signal to become unstable earlier than they would otherwise be in pessimistic analysis) for the types of signal transitions that are known to inhibit a transition on the output.

More specifically, for an AND clock gate controlling an active-high clock, the setup test between the falling gate input and the rising clock input ensures that an output transition does not occur (that a glitch does not occur at the beginning of the clock pulse), and thus is treated specially. In other words, the invention checks the clock and gate signal states under which an active clock signal (e.g., a high clock signal for an AND clock gate) should be controlled (suppressed). For tests done in this controlling state, the invention alters the setup test to account for the fact that the output signal will not achieve a high state even if the high clock pulse arrives slightly before the gate signal transitions from high to low. Similarly, the invention alters the hold test between the rising gate input and the falling clock output while ensuring that an output transition does not occur (that a glitch does not occur at the end of the clock pulse). There is nothing critical as to the particular gating strategy (e.g., logic elements) used to gate the clock. Any complex gate can be used, and the same formalism still applies, although the actual transitions may be reversed (for example, the clock may be considered to be gated when the gating input signal rises to "1" rather than falling to "0", as with the AND or NAND gate). For example, in the case where a NOR gate is used, the setup test for the gate input transition which disables the clock output transition is between the rising gate input transition and the falling clock input transition, and the hold test for the clock input transition which disables the clock output transition is between the falling gate input transition rising clock input transition.

In one specific embodiment, the invention computes the late mode arrival time and slew at the gate output due to a disabling gate input transition, computed assuming zero output load on the clock gating circuit. The term "late mode" arrival time means the latest time that the device output could become stable. This value is compared in a setup test against the early mode arrival time arrival time at the gate output due to the leading edge clock input transition, computed using the actual output load for the clock gating device. The term "early mode" arrival time means the earliest time that the device output could begin to switch. Thus, a modified arrival time at the gate output due to a late mode disabling transition is computed assuming zero output load, and is compared against an early mode enabling transition assuming the actual load. Because delay and slew increase with load, the effect is to delay the late mode sense time, allowing the late mode signal to arrive later and/or the early mode signal to arrive earlier than would be allowed without the modification., This modification is valid because, for any input transition which does not cause an output transition, the logic gate does not "see" loading on its output, so computing the gate's delay is determined as if the gate were unloaded and is physically valid. The late mode disabling gate-to-output transition is the gate signal transition used in the setup test with the leading edge of the clock pulse to prevent clock glitching at the beginning of the clock pulse.

Similarly, this embodiment computes the late mode arrival time and slew at the gate output due to a disabling clock input transition (i.e., a trailing clock edge) assuming zero output load on the clock gating circuit. Once again, one goal of the invention is to reduce pessimism (decrease timing delays) and, in this instance, by assuming a zero output load, the clock-to-output delay is decreased. This value is compared in a hold test against the early mode arrival time arrival time at the gate output due to the enabling gate input transition, computed using the actual output load for the clock gating device to prevent glitching at the end of the clock pulse. For example, for an AND clock gate controlling an active-high clock, the setup test between the falling gate input and the rising clock input would use a gate-to-output delay computed assuming zero output load, and the hold test between the rising gate input and the falling clock output would use a clock-to-output delay computed assuming zero output load. In each case the input from which the delay is computed with zero output load is the one required to switch first and is the one whose transition prevents an output transition from occurring. Since these tests are applied to ensure that the output never actually makes a transition, this will still be slightly conservative, in that it assumes for each of the modified late mode transitions that the internal parasitic capacitance of the gate output is initially high (assuming an AND-gate, and thus a low-going clock disabling transition) and must be discharged. In IC use, the entire downstream gated clock net, including internal parasitics of the driving gate, is initially low and remains low.

The invention determines the setup time by calculating a late mode disabling gate-to-output delay and slew wherein the late mode assumes a zero-output load on the gating device and determines a hold time by calculating a late mode trailing clock-to-output transition and slew assuming zero-output load on the gating device.

As discussed above, conventional systems use $AT_{gate}+delay_{gate}+Slew_{gate}/2$ for the late mode controlling transition of the gate input in the setup time test with the leading (non-controlling) edge of the clock pulse to prevent clock glitching at the beginning of the clock pulse. In a second embodiment, the invention instead uses a computation of: $AT_{gate}+delay_{gate}-K*Slew_{gate}$, where 0<K. Similarly, instead of using $AT_{Clock}+delay_{clock}+Slew_{Clock}/2$ for the late mode controlling (trailing) clock edge used in the hold test with the enabling clock gate signal limit, transition to prevent clock "glitching" at the end of the clock pulse, the invention uses a computation of $AT_{Clock}+delay_{Clock}-K*Slew_{Clock}$. In both cases the delays and slews may be computed assuming the actual loading at the gate output, or assuming zero load as in the first embodiment. One can also apply the method of this embodiment in a non-propagated mode, with a setup test comparing $AT_{Clock}-Slew\ clock/2$ with $AT_{gate}-K*Slew_{gate}$ and a hold test comparing $AT_{Clock}-K*Slew_{Clock}$ with $AT_{gate}-Slew_{gate}/2$. Combinations of these are also possible, for example, if the gate is a simple one-stage circuit it might be assumed that the output is held as soon as a controlling input passes some specified level, thus using a setup test comparing $AT_{Clock}+delay_{Clock}-Slew_{Clock}/2$ with $AT_{gate}-K*Slew_{gate}$ and a hold test comparing $AT_{Clock}-K*Slew_{Clock}$ with $AT_{gate}+delay_{gate}-Slew_{gate}/2$.

Figure 1:
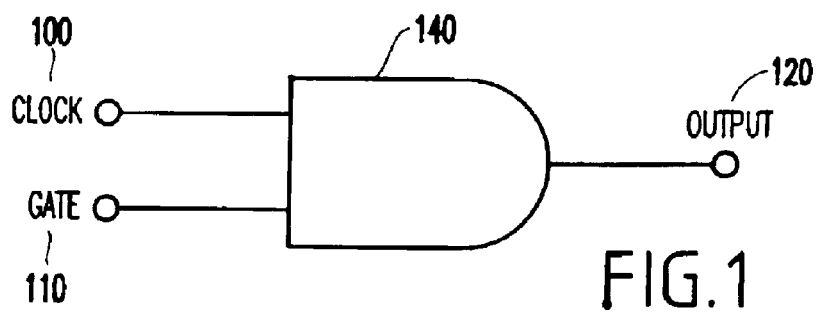
FIG. 1 shows an AND gate used for clock gating.
Figure 2:
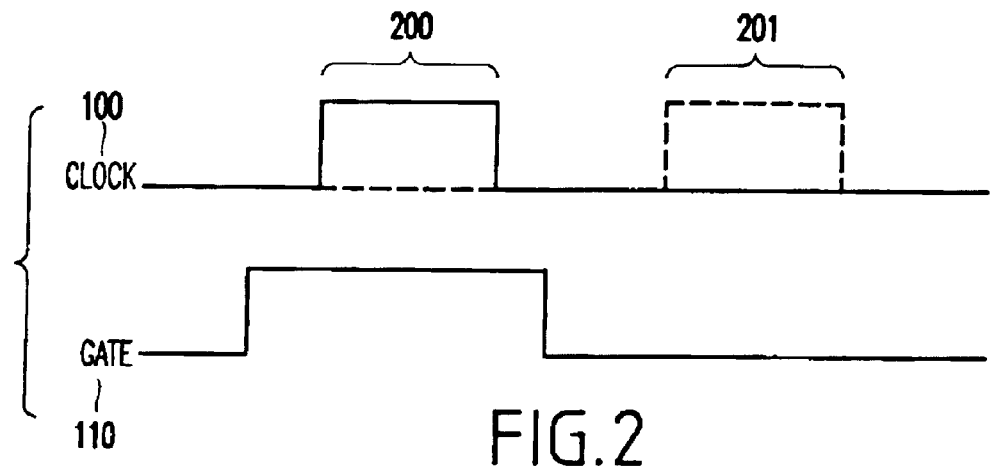
FIG. 2 shows idealized clock and gate signal waveforms of the device in FIG. 1.
Figure 3:
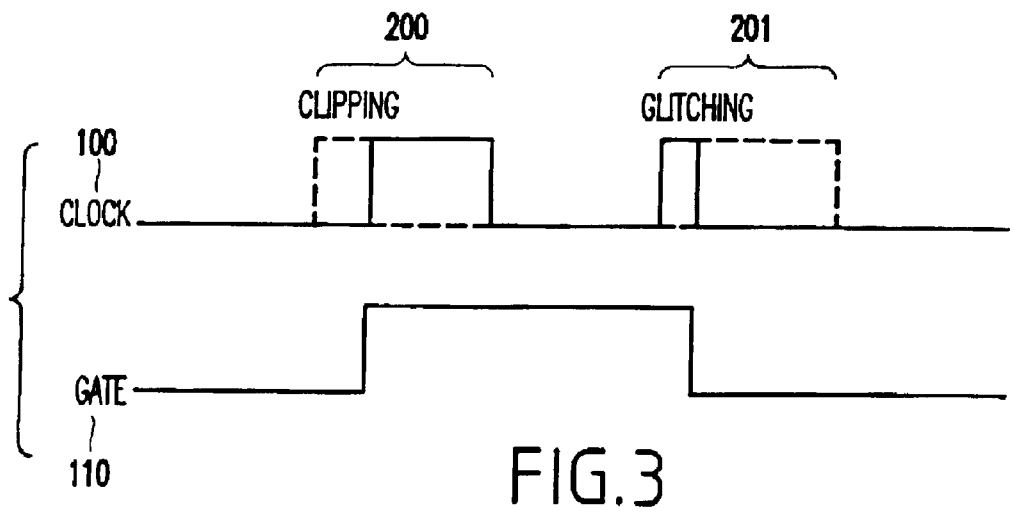
FIG. 3 shows "clipping" and "glitching" of the clock signal.
Figure 4:
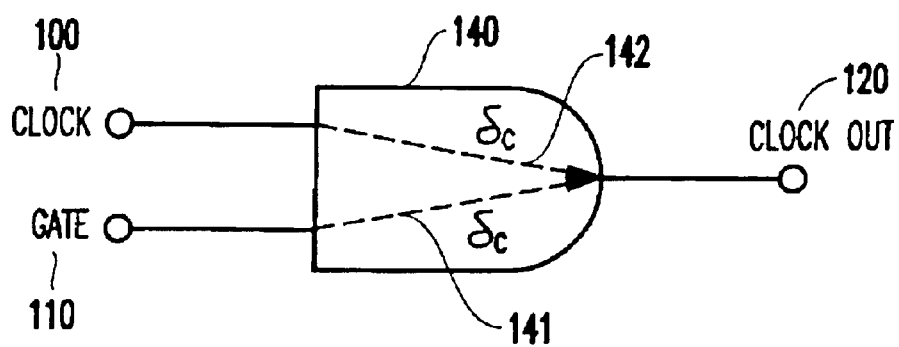
FIG. 4 shows an AND gate with representative signals being propagated to an output of the gate in FIG. 3.
Figure 5:
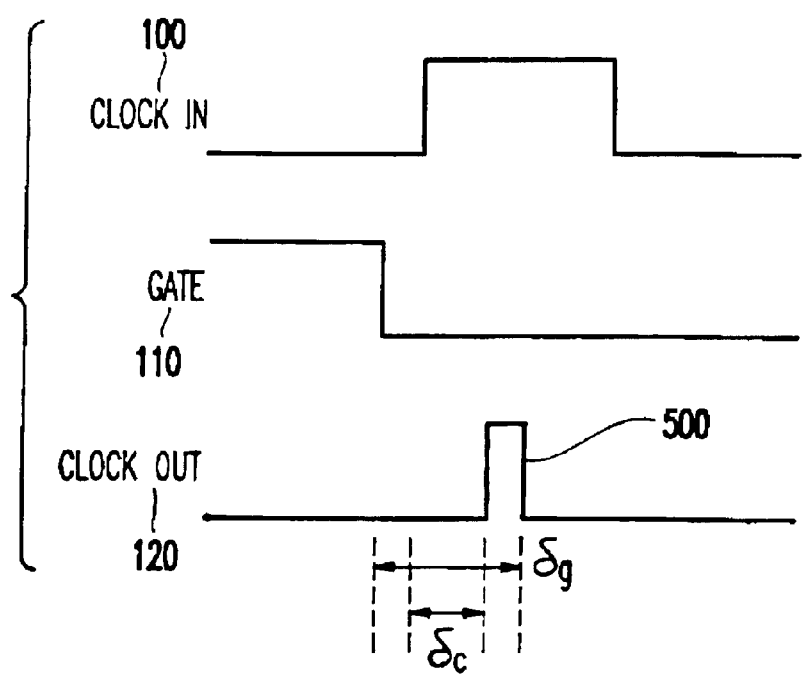
FIG. 5 shows signals Clock in, Gate and Clock out waveforms for the gate in FIG. 4 in the event that its gate to clock out delay exceeds its clock in to clock out delay.
Figure 6A:
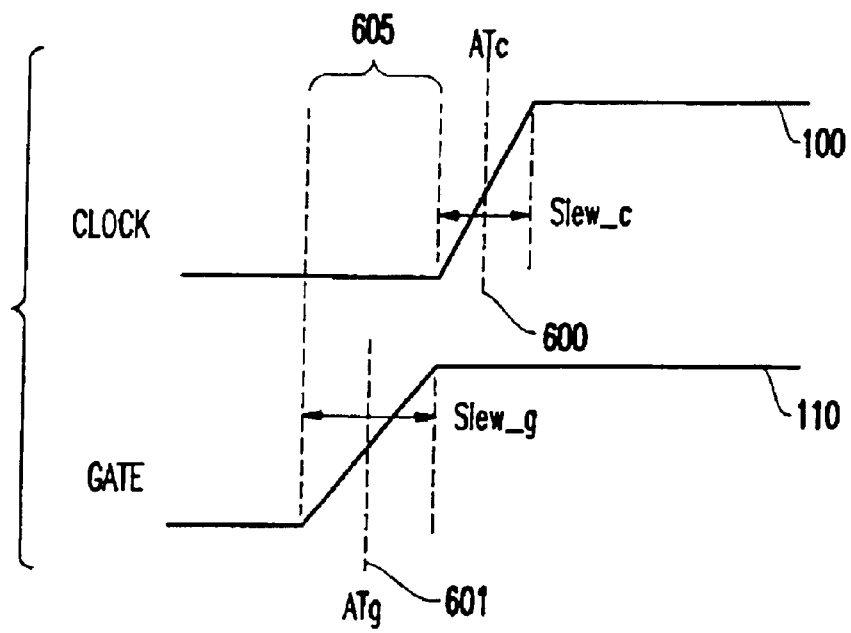
FIGS. 6A and 6B shows waveforms for clock and gate signals which meet the "propagated" clock gating setup test used in the EinsTimer timing analysis tool in current practice and under the present invention, respectively.
Figure 6B:
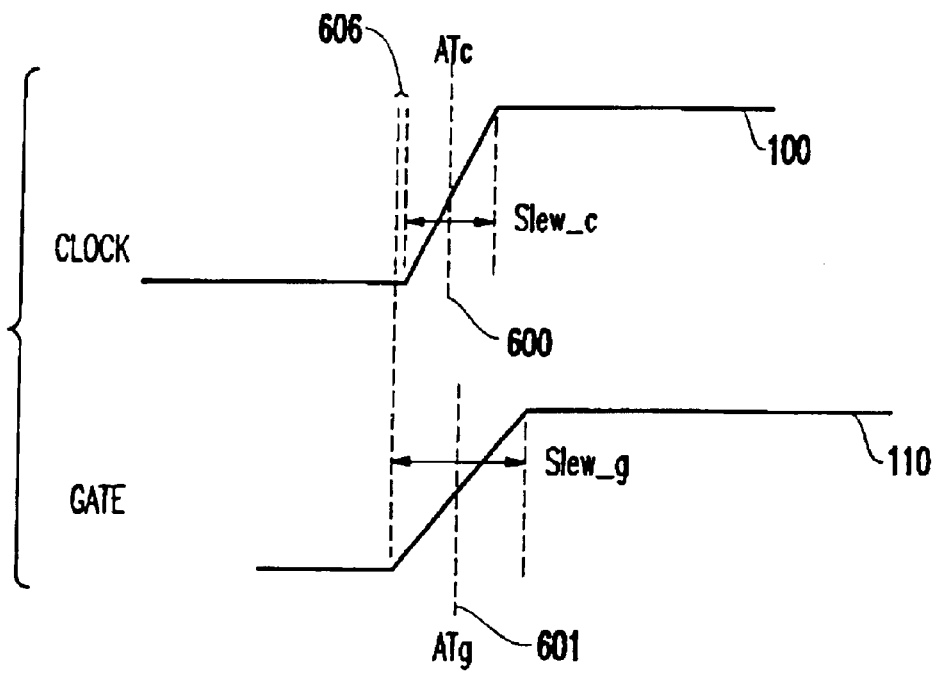

Thus, the invention again reduces pessimism by reducing the delay calculation within a circuit by reducing the slew (e.g. utilizing factor K). The delay savings can be seen when comparing FIGS. 6A and 6B. As discussed above, FIG. 6A shows a fairly pessimistic situation wherein the midpoint 601 in the slew of the gate signal 110 must occur substantially before the midpoint 600 in the slew of the clock signal 100. The difference between the leading edge of the gate signal 110 and the leading edge of the clock signal 100 is shown as time period 605. To the contrary, as shown in FIG. 6B, by utilizing a sensing point that is well in front of the midpoint 600, 601 (utilizing factor K, assuming no load, etc.), the invention is able to reduce the difference between the leading edge of the gate signal 110 and the leading edge of the clock signal 100 to a much smaller time 606. In other words, the invention is much less pessimistic and utilizes factor K to observe when the gate signal just begins its transition. Then, the invention is able to a low this sense point to occur just before when the clock signal begins its transition, as shown in FIG. 6B. In doing so, the invention reduces timing delay requirements dramatically.

As mentioned above, the invention is used with a timing analyzer that approves or disapproves a circuit design from a timing standpoint. Such timing analyzers may not just strictly "approve" a circuit design, but instead may rate the circuit design on a graduated scale. The invention recognizes that timing constraints can be relaxed considerably when the logic circuit should block a signal (to reduce the pessimism of the circuit design). Therefore, the invention will approve the timing performance of many more circuit designs than would be approved conventionally. Similarly, the invention will give higher ratings (on the graduate scale) than will be done conventionally for the timing performance of the same circuit designs. The invention relaxes timing rules (decreases pessimism) through a number of mechanisms, such as assuming that there is no load on the gate signal and multiplying the slew by factor K to modify the signal sensing time. The invention realizes that when the logic circuit should block the clock signal, the timing analyzer only needs to observe that the beginning edge of the gate signal transition has started, to find an acceptable timing situation. Thus, the invention recognizes that the logic device (gating device) will stop the clock signal as soon as the gate signal begins to transition to what is logically a blocking (gated) situation.

Further, the invention not only approves the timing of many more circuit designs than would be approved conventionally, the invention also lets the designer know that the gating signal can arrive at a later point in time and still be effective. This allows the designer to change the design and make other portions of the circuit more efficient knowing that the gating signal can arrive later and still perform its intended function.

The quantity K is then some fraction of the total transition after which it is assumed that the controlling gate input (either the clock or gate signal) would be able to hold the output in the disabled state, as if it had started in that state instead of trying to transition to it. Generally this value will be less than 0.5, but since the slew is often defined as the time required for a signal to get from 10% to 90% of its final value, K may be >0.5 if it is considered that the input signal can prevent an output transition from occurring when it has reached something less than 10% of its final value. For example, if it is desired that the output should be sufficiently held at the very beginning of the output transition, the arrival time is defined as the 50% crossing time, the slew is defined as the 10% to 90% interval, and the transition is assumed to be a simple linear ramp signal, K would be 0.5/(0.9−0.1)= 0.5/0.8=0.625. It will be understood that the appropriate value of K depends on the behavior of the gate and on the way in which arrival times and slews are defined in the static timing analysis tool. The original equation for a propagated mode is still used for the other two control edge scenarios in which a transition actually occurs (i.e., when checking for clock "clipping"). The modification of these equations provides a guard time that is applied to the arrival times of the clock and gating signals. The addition of output slew factors guarantees that all circuit effects have propagated through the circuit to the output node before they can affect the integrity of the clock pulse. This is necessary when the test is ensuring that an intended transition is not delayed or accelarated because of a late or early arriving gate signal. However, when no transition is involved, it was found that circuit designers optimize the performance of their circuit by adjusting the control signal circuit elements such that they only hold the signal level unasserted rather than forcing a transition (i.e., the clock input already took care of driving the output state unasserted, the control signal only has to hold it there). A measure of when the gating input begins to take control of the output node still involves measuring the output slew, but tacking on only enough of that time to ensure that control of the node has been gained by the gating input. This shows up in the modified equation as the "$delay_{gate} - K*Slew_{gate}$" term, since the delay measurement also contains ½ of an output slew measurement (the time it takes for the output transition to start plus the time it takes for half the output transition to have completed). By using a K-factor near 0.5, most of the artificial slew effect can be eliminated, while still making use of the need to know how long the control signal takes to propagate through the gating circuitry.

Figure 10:
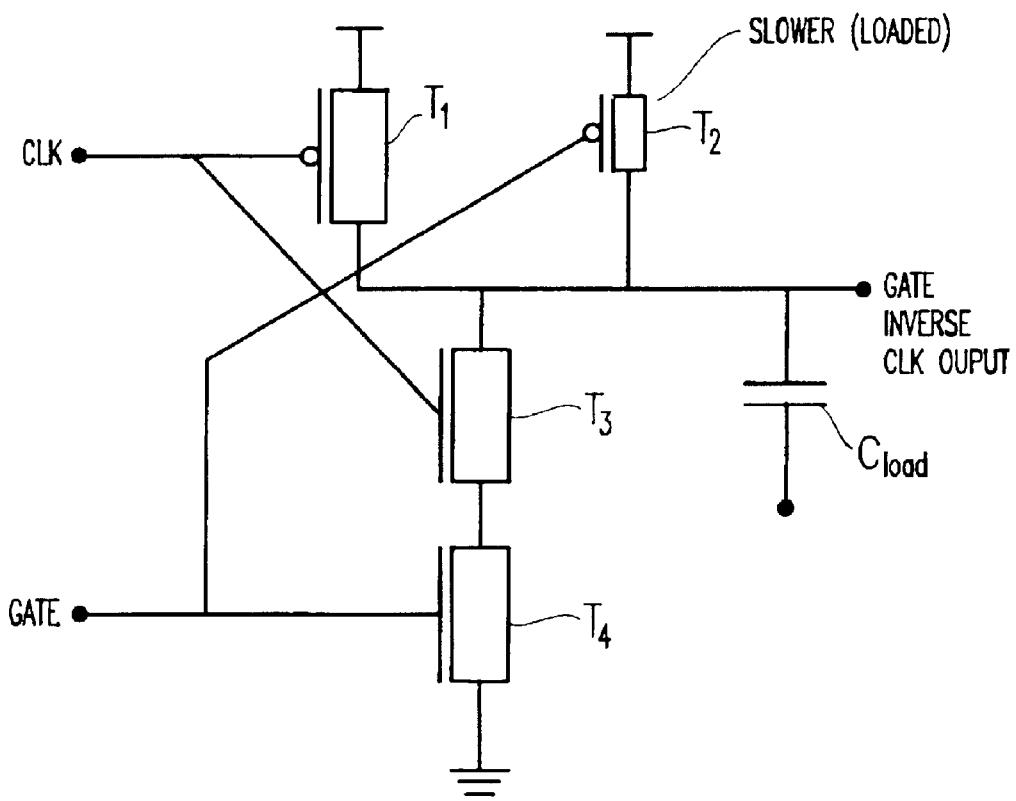
FIG. 10 shows an exemplary four transistor NAND gate circuit to illustrate the methodology of the invention.

Referring now to FIG. 10, a four-transistor (two p-type $T_1$, $T_2$, and two n-type $T_3$, $T_4$) gating device 26 is shown as an exemplary NAND clock gating device wherein the second embodiment of the invention as discussed above is implemented using EinsTimer using the methodology taught in U.S. Pat. No. 5,508,937 discussed above. The relative sizes of the transistors is represented by the relative sizes of the transistor symbols T1–T4, showing that T2, which allow the gate signal to force or hold the output high, is smaller than the other transistors. This would cause the $delay_{gate}$ and $Slew_{gate}$ values for the falling gate input and rising gate output to be large, resulting in an unacceptably pessimistic clock gating setup requirement for this gate using the conventional propagated mode clock gating tests. As would be well known to those ordinarily skilled in the art the following reference signs shown in FIG. 10 have the following meanings. The reference sign "clk" is an abbreviation for clock signal; a "gate" is a portion of a transistor; "slower (loaded)" means that the transistor in question has a load and is slower; the "gate increase clk output" means that the output is the inverse of the clock seen on the gate; and "Cload" is an expression for capacitance load.

Using the second embodiment above, with arrival times defined at the 50% crossing point and slews defined as the 10% to 90% interval, a conventional clock gating setup test is performed between, $AT_{Clock}+delay_{clock}-0.625*Slew_{clock}$ and $AT_{gate}+delay_{gate}+0.625*Slew_{gate}$, where the Slew values are measured at the gate output as a result of transitions on the respective inputs. This gives a Setup test between the gate inputs of $(Slew_{Clock}*0.625-delay_{clock}+Slew_{gate}*0.625+delay_{gate})$, which would give an unacceptably pessimistic clock gating requirement, as indicated above. This equation can be modified for the no output transition situation to a clock gating setup test between, $AT_{clock}+delay_{clock}-0.625*Slew_{clock}$ and $AT_{gate}+delay_{gate}-K*Slew_{gate}$ giving a Setup test between the gate inputs of $=(Slew_{clock}*0.625-delay_{clock}-Slew_{gate}*K+delay_{gate})$, wherein the K factor is chosen to give a sufficient margin (weighting) to the effect of the gating pull up turn-on to consider the output of the clock-gate to be held in the "OFF" state, thus reducing the pessimism in the clock gating test.

Figure 11:
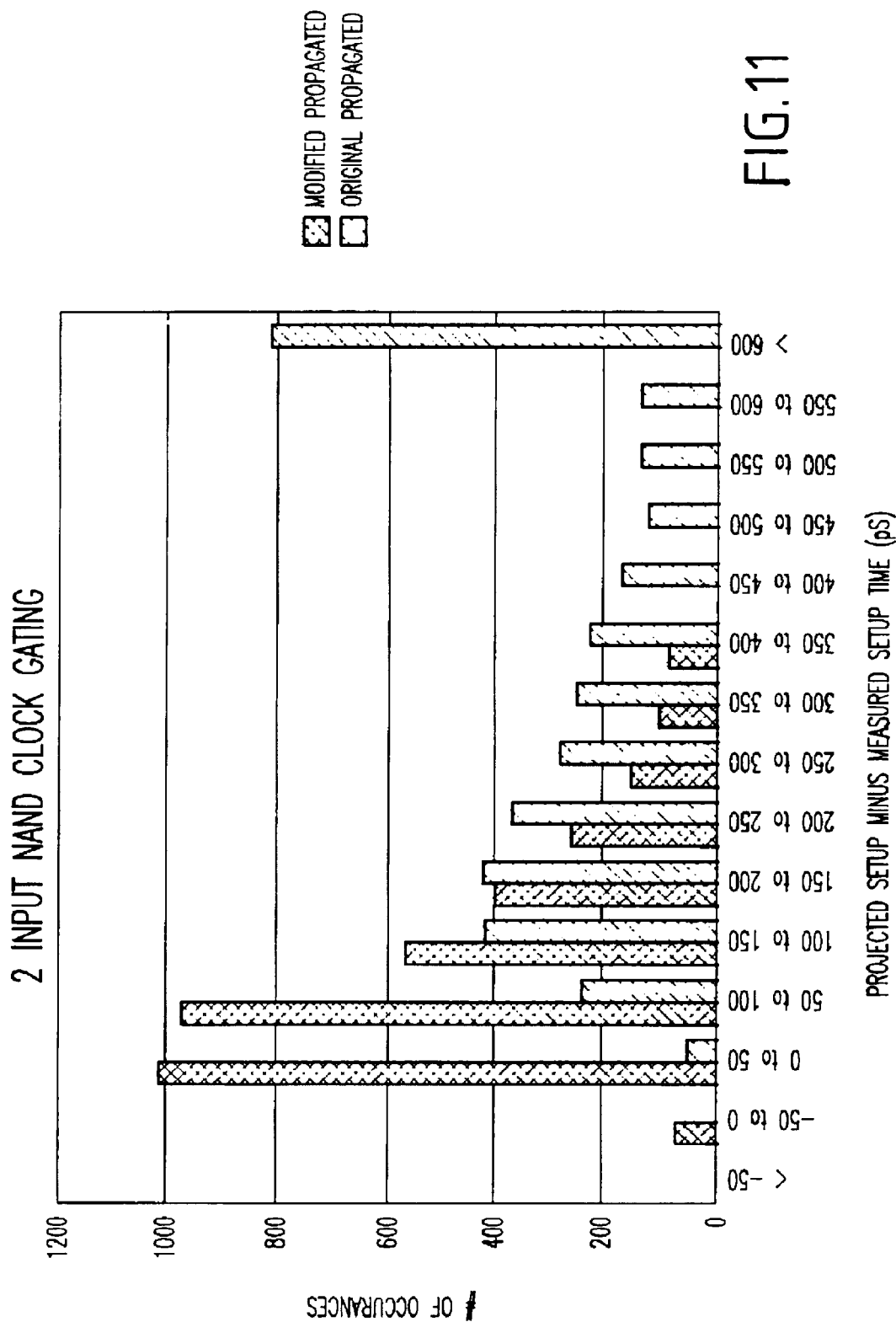
FIG. 11 shows a histogram of the error in setup time comparing conventional methodologies with the improved methodology afforded by the invention.

The setup times determined by the second embodiment are compared against results of a simulation approach in FIG. 11. Then the projected setup time (from the above equations, using K=0.5) was calculated and the measured ("real") setup time determined through simulation to determine the error in the computed setup time was then subtracted from the projected setup time. A positive error is pessimistic (i.e., requires the disabling gate transition to arrive earlier than necessary), and a negative error is optimistic (i.e., allowing the disabling clock gate transition to arrive later than necessary). This is done over a very wide set of transistor widths, output capacitance loadings, and input slews (# of occurrances). The resultant error over various combinations of these parameters is shown in the histogram in FIG. 11, wherein the second embodiment of invention (modified propagated) is used and provides a tighter distribution than the original propagated method.

In another embodiment, the invention uses the least pessimistic of the input-to-input and "propagated" AT tests for the disabling setup test and the enabling hold test. This has much the same effect as the first embodiment above in situations when the internal dynamics of the gate and the time required for the clock input signal to cause a transition on the output are fast compared to the time required for the gate input signal to cause a transition on the output (i.e., when an asymmetric clock gating circuit is used). The benefit over the first embodiment is that it does not require recalculation of the gate delay with zero output load.

In each of these three embodiments, the effective late mode sensing time for the disabling clock gate transition and for the trailing clock edge transition is reduced, thus allowing a later arriving disabling clock gate signal and an earlier arriving enabling clock gate signal to be used and still meet clock gating requirements. Also, in each embodiment an additional amount may be added to all setup and/or hold test values to provide extra tolerance for variation within the circuit.

Although this invention has been described in terms of clock gating, the same approach may be used in any case in which a static timing analysis test is used to ensure that a first transition on one input of a circuit prevents the propagation of second transition on another input of the circuit. In such cases, the modifications described above are applied to the late mode value of the first transition, which prevents the early mode value of the second transition from propagating.

While the invention has been described in terms of its use during static timing analysis, it could also be used during a delay abstraction process, as described in U.S. Pat. No. 5,535,145, in which a simplified delay model is created for a portion of a design, for subsequent use in the static timing analysis of the entire design. In this application, for the first embodiment of the present invention, one must compute and include in the generated abstraction zero-load delays rather than normally loaded delays for all gate input to output paths which are always expected to be involved in a transition-disabling clock gating test. For those gate input to output paths for which it is not known at the time the abstraction process is performed whether or not the path will be used only for transition-disabling clock gating tests, both zero-load and normally loaded delays must be included in the abstraction, and the gate output must be retained as a node in the abstraction. For the second embodiment of the present invention, one must compute internal setup tests included in the abstraction according to the second embodiment for all gate input to output paths which are always expected to be involved in a transition-disabling clock gating test. For those gate input to output paths for which it is not known at the time the abstraction process is performed whether or not the path will be used only for transition-disabling clock gating tests, the gate output must be retained as a node in the abstraction. For the third embodiment and for the variation of the second embodiment in which tests are performed between the input pins rather than the output pins, the inputs of any gate which may be used for transition-disabling clock gating tests must be retained as nodes in the abstraction.

The invention is used with a timing analyzer that approves or disapproves a circuit design from a timing standpoint. Such timing analyzers may not just strictly "approve" a circuit design, but instead may rate the circuit design on a graduated scale. The invention recognizes that timing constraints can be relaxed considerably when the logic circuit should block a signal (to reduce the pessimism of the circuit design). Therefore, the invention will approve the timing performance of many more circuit designs than would be approved conventionally. Similarly, the invention will give higher ratings (on the graduate scale) than will be done conventionally for the timing performance of the same circuit designs. The invention relaxes timing rules (decreases pessimism) through a number of mechanisms, such as assuming that there is no load on the gate signal and multiplying the slew by factor K to modify the signal sensing time. The invention realizes that when the logic circuit should block the clock signal, the timing analyzer only needs to observe that the beginning edge of the gate signal transition has started, to find an acceptable timing situation. Thus, the invention recognizes that the logic device (gating device) will stop the clock signal as soon as the gate signal begins to transition to what is logically a blocking (gated) situation.

Further, the invention not only approves the timing of many more circuit designs than would be approved conventionally, the invention also lets the designer know that the gating signal can arrive at a later point in time and still be effective. This allows the designer to change the design and make other portions of the circuit more efficient knowing that the gating signal can arrive later and still perform its intended function.

While the invention has been described in terms of preferred embodiments, those skilled in the art will recognize that the invention can be practiced with modification within the spirit and scope of the appended claims.

What is claimed is:

1. A method for evaluating gate timing in an integrated circuit (IC) design, said method comprising:

determining when a first type of signal is present on an input to a logical gating device, wherein said first type of input signal allows transitions on an output of said logical gating device;

determining when a second type of signal is present on said input, wherein said second type of input signal inhibits transitions on said output of said logical gating device; and modifying a timing of a sensing of said first type of signal to sense said first type of signal at an earlier point in time than said second type of signal is sensed.

2. The method of claim 1, wherein:

said input comprises a gate input;

said first-type of signal and said second-type of signal comprise gating signals; and said first-type of signal and said second-type of signal control whether pulses on a clock input of said logical gating device are propagated to said output of said logical gating device.

3. The method of claim 1, wherein said first type of signal allows clock pulses to be propagated on said output of said logical gating device and said second type of signal prevents said clock pulses from being propagated on said output of said logical gating device.

4. The method of claim 1, wherein said sensing is used in computing a setup test.

5. The method of claim 1, wherein said sensing is used in computing a hold test.

6. The method in claim 1, wherein said modifying prevents a delay in propagation of gating signals across logical gating device from inappropriately outputting a portion of a clock pulse.

7. The method in claim 1, wherein said modifying is performed assuming there is no load on said output.

8. The method in claim 1, wherein said modifying includes identifying a beginning point of a transition of said first-type of signal as a time when said first-type signal is sensed.

9. The method of claim 4, wherein the computing of said setup test comprises:

computing a propagated mode test value, computing an input-to-input test value of zero, and using the less pessimistic of said computed test values.

10. A method for evaluating gate timing in an integrated circuit (IC) design, said method comprising:

determining when a first type of signal is present on an input to a logical gating device, wherein said first type of input signal allows a clock pulse to be output from said logical gating device;

determining when a second type of signal is present on said input, wherein said second type of input signal inhibits said clock pulse from being output from said logical gating device; and modifying a timing of a sensing of said first type of signal to sense said first type of signal at an earlier point in time than said second type of signal is sensed.

11. The method of claim 10, wherein:

said input comprises a gate input;

said first-type of signal and said second-type of signal comprise gating signals.

12. The method of claim 10, further comprising performing a hold test between said input and a clock input of said logical gating device.

13. The method in claim 10, wherein said modifying prevents a delay in propagation of gating signals across said logical gating device from inappropriately outputting a portion of said clock pulse.

14. The method of claim 10, wherein said modifying is performed assuming there is no load on said output.

15. The method in claim 10, wherein said modifying includes identifying a beginning point of a transition of said first-type of signal as a time when said first-type signal is sensed.

16. A program storage device readable by machine, tangibly embodying a program of instructions executable by said machine for performing a method of evaluating gate timing in an integrated circuit (IC) design, said method comprising:

determining when a first type of signal is present on an input to a logical gating device, wherein said first type of input signal allows transitions on an output of said logical gating device;

determining when a second type of signal is present on said input, wherein said second type of input signal inhibits transitions on said output of said logical gating device; and modifying a timing of a sensing of said first type of signal to sense said first type of signal at an earlier point in time than said second type of signal is sensed.

17. The program storage device of claim 16, wherein:

said input comprises a gate input;

said first-type of signal and said second-type of signal comprise gating signals; and said first-type of signal and said second-type of signal control whether pulses on a clock input of said logical gating device are propagated to said output of said gate device.

18. The program storage device of claim 16, wherein said first type of signal allows clock pulses to be propagated on said output of said logical gating device and said second type of signal prevents said clock pulses from being propagated on said output of said logical gating device.

19. The program storage device of claim 17, further comprising performing a hold test between said input and said clock input of said logical gating device.

20. The program storage device in claim 16, wherein said modifying prevents a delay in propagation of gating signals across said logical gating device from inappropriately outputting a portion of a clock pulse.

21. The program storage device of claim 16, wherein said modifying is performed assuming there is no load on said output.

22. The program storage device in claim 16, wherein said modifying includes identifying a beginning point of a transition of said first-type of signal as a time when said first-type signal is sensed.

23. A method of evaluating gate timing in an integrated circuit (IC) design, said method comprising:

determining when a rising gating signal is present on an input to a logical gating device, wherein, after rising, said gating signal allows transitions on an output of said logical gating device; and modifying a timing of a sensing of said rising gating signal to sense said rising gating signal at a point in time earlier than a midpoint between a low gating signal and a high gating signal.

24. The method of claim 23, wherein said gating signal controls whether pulses on a clock input of said logical gating device are propagated to said output of said logical gating device.

25. The method of claim 23, wherein said sensing is used in computing one of a setup test and a hold test.

26. The method of claim 23, wherein said modifying prevents a delay in propagation of gating signals across said logical gating device from inappropriately outputting a portion of a clock pulse.

27. The method of claim 23, wherein said modifying is performed assuming there is no load on said output.

28. The method of claim 23, wherein said modifying includes identifying a beginning point of a transition of said gating signal as a time when said gating signal is sensed.

29. A method for evaluating gate timing in an integrated circuit (IC) design, said method comprising:

determining when a rising gating signal is present on an input to a logical gating device, wherein, after rising, said gating signal allows transitions on an output of said logical gating device; and modifying a timing of a sensing of said rising gating signal to sense said rising gating signal at a point in time earlier than a midpoint between a low gating signal and a high gating signal by reducing slew by a predetermined constant.

30. The method of claim 29, wherein said gating signal controls whether pulses on a clock input of said logical gating device are propagated to said output of said logical gating device.

31. The method of claim 29, wherein said sensing is used in computing one of a setup test and a hold test.

32. The method of claim 29, wherein said modifying prevents a delay in propagation of gating signals across said logical gating device from inappropriately outputting a portion of a clock pulse.

33. The method of claim 29, wherein said modifying is performed assuming there is no load on said output.

34. The method of claim 29, wherein said modifying includes identifying a beginning point of a transition of said gating signal as a time when said gating signal is sensed.

* * * * *